United States Patent
Majhi et al.

(10) Patent No.: US 11,626,437 B2
(45) Date of Patent: Apr. 11, 2023

(54) INTEGRATION OF METASURFACE LENS ON WAFER LEVEL SUBSTRATE

(71) Applicant: Intel Corporation, Santa Clara, CA (US)

(72) Inventors: Prashant Majhi, San Jose, CA (US); Kunjal Parikh, Fremont, CA (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 874 days.

(21) Appl. No.: 16/356,413

(22) Filed: Mar. 18, 2019

(65) Prior Publication Data

US 2020/0303442 A1 Sep. 24, 2020

(51) Int. Cl.
*H01L 27/146* (2006.01)
*H01L 21/20* (2006.01)
*H01L 21/768* (2006.01)

(52) U.S. Cl.
CPC .... *H01L 27/14625* (2013.01); *H01L 21/2007* (2013.01); *H01L 21/768* (2013.01); *H01L 27/14632* (2013.01)

(58) Field of Classification Search
CPC .................... H01L 27/14625; H01L 27/14632
See application file for complete search history.

(56) References Cited

U.S. PATENT DOCUMENTS 10,921,258 B2 * 2/2021 Kim ........................ G02B 5/008

* cited by examiner

*Primary Examiner* — Samuel A Gebremariam
(74) *Attorney, Agent, or Firm* — Schwabe, Williamson & Wyatt, P.C.

(57) ABSTRACT

Embodiments herein describe techniques for an optical device including a substrate of a wafer. An image sensor device is formed on a front side of the substrate, while a plurality of posts of a metasurface lens are formed on a backside opposite to the front side of the substrate. A post of the plurality of posts includes a metasurface material that is transparent to light. Other embodiments may be described and/or claimed.

18 Claims, 9 Drawing Sheets

INTEGRATION OF METASURFACE LENS ON WAFER LEVEL SUBSTRATE

FIELD

Embodiments of the present disclosure generally relate to the field of optical devices, and more particularly, to optical device with metasurface lens.

BACKGROUND

An optical device or system, e.g., a camera system, may include lens, image sensors devices, and other processing components. Image sensor devices may receive incident light (photons) through a lens or other optics, and transfer light energy to electrical energy. There are various kinds of image sensor devices such as CMOS and charge-coupled device (CCD) sensors. Conventional lenses may work with light having wavelength in the order of micrometer range. On the other hand, a metasurface lens may work with light having wavelength in the order of nanometers range. However, current optical solutions may have multiple lens pieces with complex setup, e.g., alignment of lenses along the optical axis, grinding and polishing to drive curvature, etc., which lead to lower yield, low quality, and high cost.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Optical systems may have various applications beyond the traditional camera systems. For example, a computing device may include an optical system to perform face login application. In an optical system, e.g., a camera system, an image sensor device receives incident light (photons) through a lens or other optics. Afterwards, the image sensor device transfers the light into a voltage or a digital signal. For example, a CMOS image sensor device converts photons into electrons, then to a voltage, further into a digital value using an on-chip analog to digital converter (ADC). Current methodologies of building an optical system significantly limits the quality of the optical system, e.g., resolution, chromatic aberration, modulation transfer function. For example, a current optical system with a metasurface lens may be bulky, employing multi-lenses layers, and may not be a wafer level optical system. Such an optical system with a metasurface lens may only be available for low end front facing camera.

Embodiments herein may present monolithic integration of a metasurface lens onto a wafer level substrate of an image sensor device, e.g., CMOS image sensors, to build a wafer level optical system. The metasurface lens may have multiple posts including a metasurface material that is transparent to light with a high refractive index, e.g., greater than or equal to 2. The metasurface lens may be formed using a single mask that reduces cost for photolithography, alignment, etc. The posts of the metasurface lens may have various structures, e.g., with hollow geometries or concentric layers. The so formed wafer level optical system may be used in a high resolution back side camera or an automotive camera.

Embodiments herein may present an optical device including a substrate of a wafer. An image sensor device is formed on a front side of the substrate, while a plurality of posts of a metasurface lens are formed on a backside opposite to the front side of the substrate. A post of the plurality of posts includes a metasurface material that is transparent to light.

Embodiments herein may present a method for forming an optical device. The method includes: forming an image sensor device on a front side of a substrate of a wafer; forming a plurality of posts of a metasurface lens on a backside opposite to the front side of the substrate, where a post of the plurality of posts includes a metasurface material that is transparent to light. Furthermore, the method includes filling a gap between two posts of the plurality of posts by a separation material.

Embodiments herein may present a computing device including a first wafer and a second wafer bonded to the first wafer. The first wafer includes a substrate, an image sensor device on a front side of the substrate, and a plurality of posts of a metasurface lens on a backside opposite to the front side of the substrate. A post of the plurality of posts includes a metasurface material that is transparent to light. The second wafer may be bonded to the image sensor device of the first wafer.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

Figure 1A:
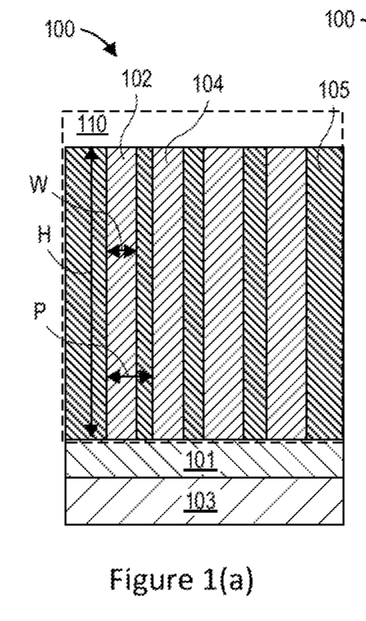
FIGS. 1(a)-1(d) schematically illustrate diagrams of an optical device including a metasurface lens with a plurality of posts formed on a substrate of a wafer, in accordance with some embodiments.
Figure 1B:
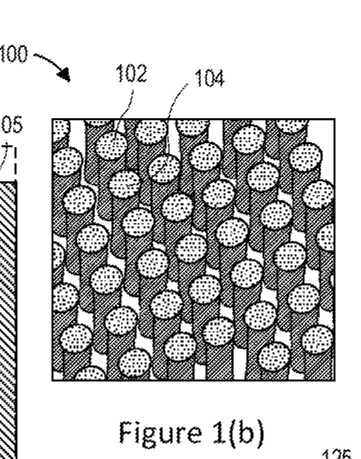
Figure 1C:
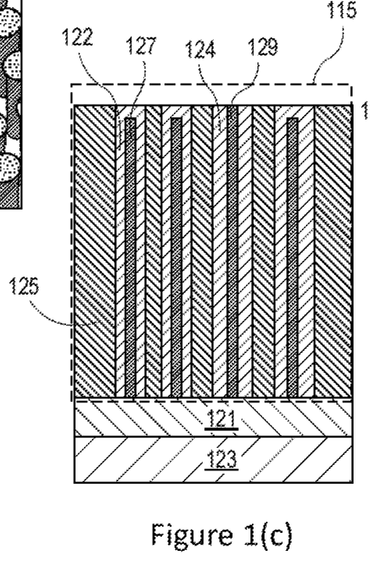
Figure 1D:
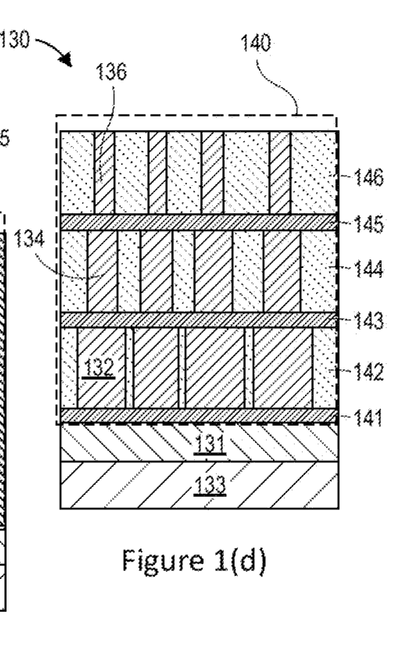

FIGS. 1(a)-1(d) schematically illustrate diagrams of an optical device including a metasurface lens with a plurality of posts formed on a substrate of a wafer, in accordance with some embodiments. For example, as shown in FIGS. 1(a)-1(b), an optical device 100 includes a metasurface lens 110 having a plurality of posts, e.g., a post 102, a post 104, formed on a substrate 101 of a wafer. As shown in FIG. 1(c), an optical device 120 includes a metasurface lens 115 having a plurality of posts, e.g., a post 122, a post 124, formed on a substrate 121 of a wafer. Furthermore, as shown in FIG. 1(d), an optical device 130 includes a metasurface lens 140 having a plurality of posts, e.g., a post 132, a post 134, a post 136, formed on a substrate 131 of a wafer.

In embodiments, as shown in FIG. 1(a) in cross section view or shown in FIG. 1(b) in three dimensional view, the optical device 100 includes the substrate 101, an image sensor device 103, and the metasurface lens 110 having a plurality of posts, e.g., the post 102, the post 104, formed on the substrate 101. A separation material 105 is between any two posts of the plurality of post of the metasurface lens 110, e.g., the post 102, the post 104. The image sensor device 103 is formed on a front side of the substrate 101, and the plurality of posts of a metasurface lens, e.g., the post 102, the post 104, are formed on a backside opposite to the front side of the substrate 101. Hence, the image sensor device 103 and the metasurface lens 110 may be a part of a wafer level backside camera.

The substrate 101 may include fused silica. The separation material 105 may include carbon doped silicon oxide, SiO2, or SiNx. A post, e.g., the post 102, may include a metasurface material that is transparent to light. The metasurface material may have a high refractive index, e.g., larger than or equal to 2. For example, the metasurface material may include TiO2, ZrO2, ZnTe, ZnxCd(1−x)Te, Al_xGa_1−xAs, AgTe, AgSe, or other high refractive index and transparent material.

In embodiments, the post 102 or the post 104 may be of a cylindrical or cubic shape. For example, the post 102 may be of a cylindrical with a diameter W in a range of about 40 nm to 100 nm, and a height H of about 400 nm to 600 nm.

In embodiments, a center-to-center pitch P between two posts, e.g., the post 102 and the post 104, may be about 60 nm. In embodiments, the post 102 may be of a first shape, and the post 104 may be of a second shape different from the first shape. The plurality of posts may be arranged in a hexagonal lattice, circular rows, a square grid, or other shapes according to the application.

In embodiments, as shown in FIG. 1(c) in cross section view, the optical device 120 includes the substrate 121, an image sensor device 123, and the metasurface lens 115 having a plurality of posts, e.g., the post 122, the post 124, formed on the substrate 121. A separation material 125 is between any two posts of the plurality of posts of the metasurface lens 115, e.g., the post 122, the post 124. The image sensor device 123 is formed on a front side of the substrate 121, and the plurality of posts of a metasurface lens, e.g., the post 122, the post 124, are formed on a backside opposite to the front side of the substrate 121. Hence, the image sensor device 123 and the metasurface lens 115 may be a part of a wafer level backside camera.

In embodiments, the post 122 may include a cavity filled by a separation material 127, and the separation material 127 may include air, SiO2, SiNx, or carbon doped silicon oxide. For the post 122, the separation material 127 may be within the post 122. In addition, the post 124 includes a cavity filled by a separation material 129, where the separation material 129 may have a coplaner surface with the post 124.

In embodiments, as shown in FIG. 1(d) in cross section view, the optical device 130 includes the substrate 131, an image sensor device 133, and the metasurface lens 140 having a plurality of posts, e.g., the post 132, the post 134, the post 136, formed on the substrate 131. The image sensor device 133 is formed on a front side of the substrate 131, and the plurality of posts of the metasurface lens 140, e.g., the post 132, the post 134, the post 136, are formed on a backside opposite to the front side of the substrate 131. Hence, the image sensor device 133 and the metasurface lens 140 may be a part of a wafer level backside camera. The post 132 is in a first layer 142 above the substrate 131, the post 134 is in a second layer 144 above the first layer 142, and the post 136 is in a third layer 146 above the second layer 144. There may be separation layers, e.g., a layer 141, a layer 143, and a layer 145, to separate the layers of the posts, e.g., the first layer 142, the second layer 144, and the third layer 146. The post 132, the post 134, and the post 136 are concentric. The post 132 may have a first diameter, the post 134 may have a second diameter smaller than the first diameter. Similarly, the post 136 may have a third diameter smaller than the second diameter. In some embodiments, the metasurface lens 140 may have only two layers 142 and 144, without the layer 146. In some other embodiments, the metasurface lens 140 may have more than 3 layers of posts above the substrate 131.

Figure 2A:
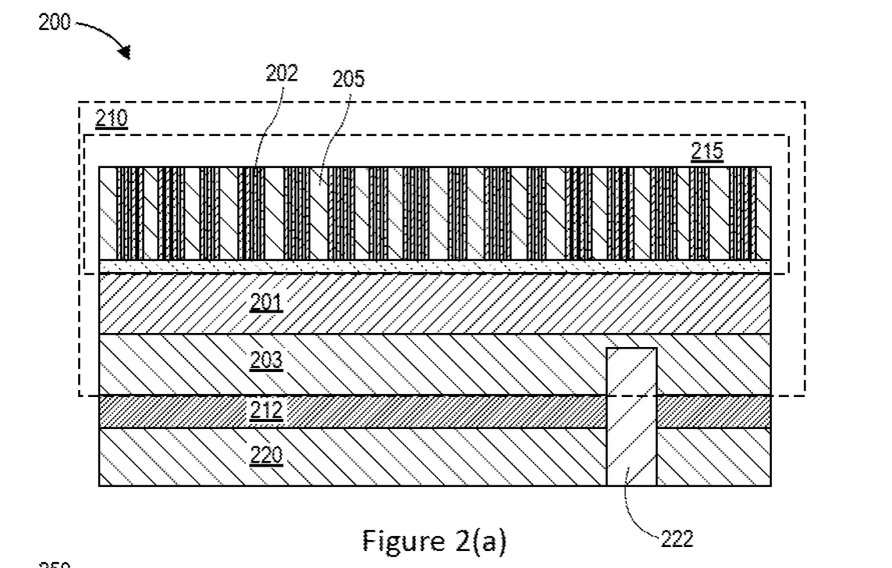
FIGS. 2(a)-2(b) schematically illustrate diagrams of an optical device including a second wafer bonded to a first wafer including an image sensor device and a metasurface lens with a plurality of posts, in accordance with some embodiments.
Figure 2B:
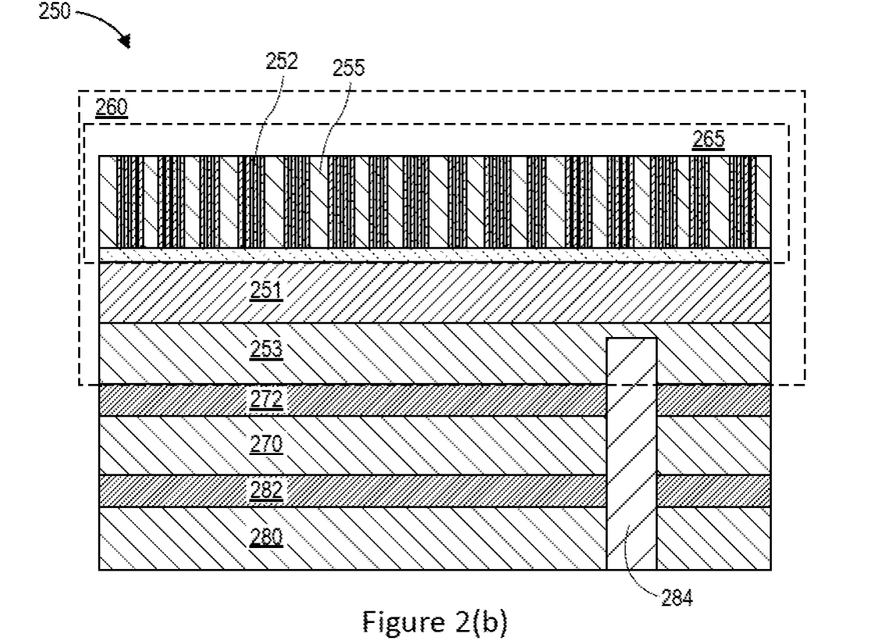

FIGS. 2(a)-2(b) schematically illustrate diagrams of a computing device including a second wafer bonded to a first wafer including an image sensor device and a metasurface lens with a plurality of posts, in accordance with some embodiments.

For example, as shown in FIG. 2(a), a computing device 200 includes a second wafer 220 bonded to a first wafer 210, where the first wafer 210 includes an image sensor device 203 and a metasurface lens 215 with a plurality of posts, e.g., a post 202. The plurality of posts are separated from each other by a separation material 205. The first wafer 210 may be similar to the wafer containing the optical device 100 in FIG. 1(a), the wafer containing the optical device 120 in FIG. 1(c), or the wafer containing the optical device 130 in FIG. 1(d). The first wafer 210 includes a substrate 201, the image sensor device 203 is formed on a front side of the substrate 201, and the metasurface lens 210 with the plurality of posts e.g., the post 202, are formed on a backside opposite to the front side of the substrate 201. The second wafer 220 may be bonded to the image sensor device 203 of the first wafer 210. There may be a wafer bonding interface 212 between the first wafer 210 and the second wafer 220. In embodiments, the second wafer 220 may include a memory device or a processor. The second wafer 220 may be bonded to the first wafer 210 by fusion bonding or hybrid bonding. In addition, one or more through silicon via (TSV) interconnects, e.g., a TSV 222, may be formed between the first wafer 210 and the second wafer 220.

For example, as shown in FIG. 2(b), a computing device 250 includes a second wafer 270 bonded to a first wafer 260, and a third wafer 280 bonded to the second wafer 270. The first wafer 260 includes an image sensor device 253 and a metasurface lens 265 with a plurality of posts, e.g., a post 252. The plurality of posts are separated from each other by a separation material 255. The first wafer 260 may be similar to the wafer containing the optical device 100 in FIG. 1(a), the wafer containing the optical device 120 in FIG. 1(c), or the wafer containing the optical device 130 in FIG. 1(d). The first wafer 260 includes a substrate 251, the image sensor device 253 is formed on a front side of the substrate 251, and the metasurface lens 265 with the plurality of posts e.g., the post 252, is formed on a backside opposite to the front side of the substrate 251. The second wafer 260 may be bonded to the image sensor device 253 of the first wafer 260. There may be a wafer bonding interface 272 between the first wafer 260 and the second wafer 270. The third wafer 280 is bonded to the second wafer 270. There may be a wafer bonding interface 282 between the third wafer 280 and the second wafer 270. In embodiments, the second wafer 270 or the third wafer 280 may include a memory device or a processor. The second wafer 270 or the third wafer 280 may be bonded by fusion bonding or hybrid bonding. In addition, one or more through silicon via (TSV) interconnects, e.g., a TSV 284, may be formed between the first wafer 260, the second wafer 270, or the third wafer 280.

Figure 3:
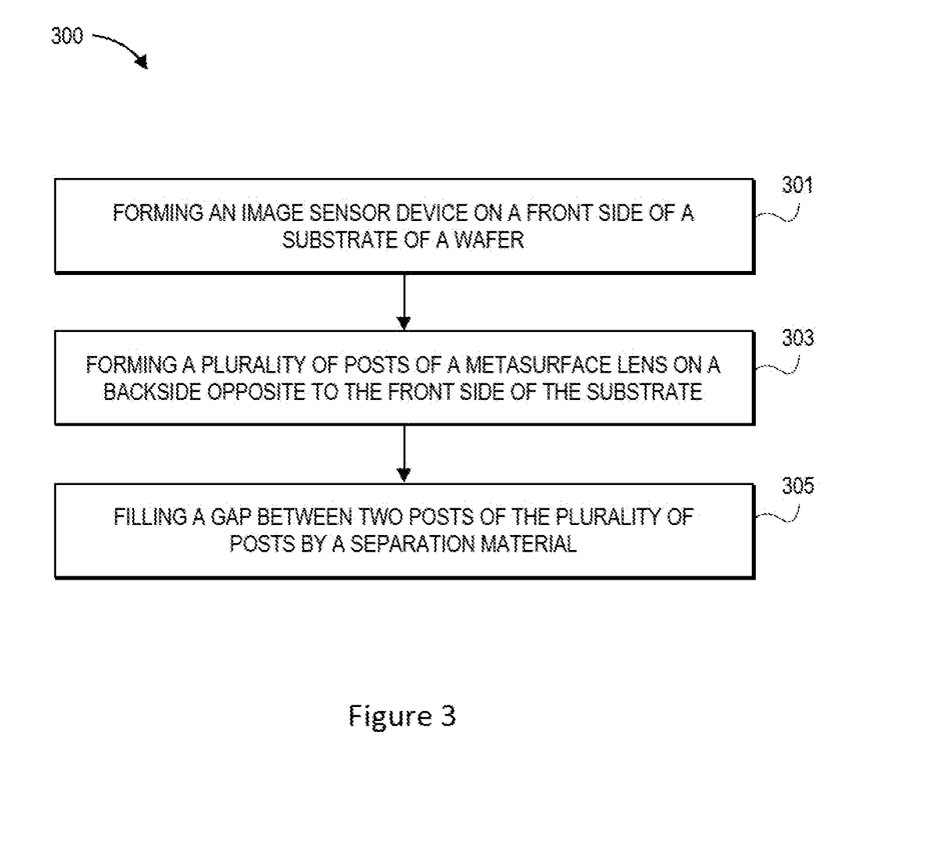
FIG. 3 schematically illustrates a process for forming an optical device including a metasurface lens with a plurality of posts on a substrate of a wafer, in accordance with some embodiments.

FIG. 3 schematically illustrates a process 300 for forming an optical device including a metasurface lens with a plurality of posts on a substrate of a wafer, in accordance with some embodiments. In embodiments, the process 300 may be applied to form the optical device 100 in FIG. 1(a), the optical device 120 in FIG. 1(c), or the optical device 130 in FIG. 1(d).

At block 301, the process 300 may include forming an image sensor device on a front side of a substrate of a wafer. For example, as shown in FIG. 1(a), the process 300 may include forming the image sensor device 103 on a front side of the substrate 101 of the wafer.

At block 303, the process 300 may include forming a plurality of posts of a metasurface lens on a backside opposite to the front side of the substrate, wherein a post of the plurality of posts includes a metasurface material that is transparent to light. For example, as shown in FIG. 1(a), the process 300 may include forming a plurality of posts of the metasurface lens 110 on a backside opposite to the front side of the substrate 101. The post 102 or the post 104 includes a metasurface material that is transparent to light.

At block 305, the process 300 may include filling a gap between two posts of the plurality of posts by a separation material. For example, as shown in FIG. 1(a), the process 300 may include filling a gap between the post 102 and the post 104 by the separation material 105.

In embodiments, the wafer including the metasurface lens 110 and the image sensor device 103 may be a first wafer. The process 300 may further include bonding a second wafer to the image sensor device of the first wafer, and forming a through silicon via (TSV) interconnect between the first wafer and the second wafer. For example, as shown in FIG. 2(a), the first wafer 210 may be similar to the wafer including the metasurface lens 110 and the image sensor device 103. The process 300 may be applied to bond the second wafer 220 to the first wafer 210, and form the TSV 222.

FIGS. 4(a)-4(d) schematically illustrate a process 400 for forming a plurality of posts of a metasurface lens on a substrate of a wafer, in accordance with some embodiments. In embodiments, the process 400 may be applied to form the plurality of posts, e.g., the post 102, the post 104, of the metasurface lens 110 on a backside opposite to the front side of the substrate 101, as shown in FIG. 1(a). The post 102 or the post 104 includes a metasurface material that is transparent to light.

Figure 4A:
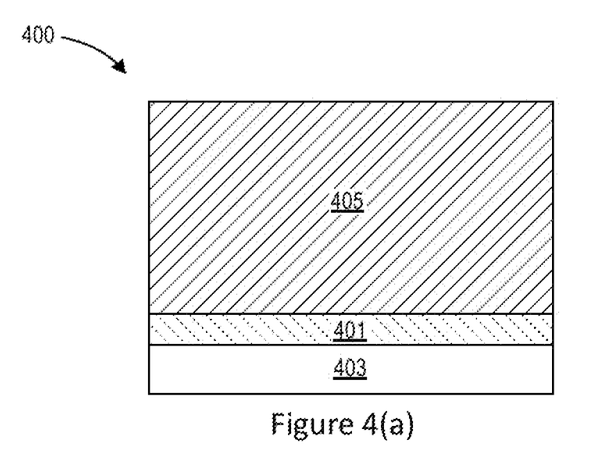
FIGS. 4(a)-4(d) schematically illustrate a process for forming a plurality of posts of a metasurface lens on a substrate of a wafer, in accordance with some embodiments.

As shown in FIG. 4(a), a wafer with a substrate 401 may be provided. An image sensor device 403 may be formed at a front side of the substrate 401. A layer 405 of metasurface material is formed on a backside opposite to the front side of the substrate 401. The layer 405 may include a metasurface material that is transparent to light. For example, the metasurface material may include TiO2, ZrO2, ZnTe, ZnxCd(1–x)Te, Al_xGa_1–xAs, AgTe, or AgSe. The substrate 401 may include fused silica.

Figure 4B:
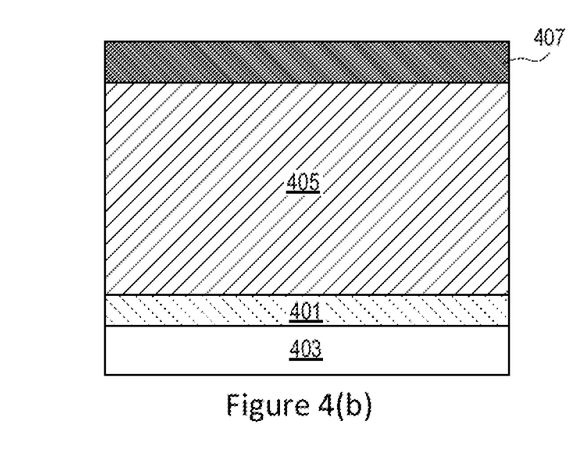
Figure 4C:
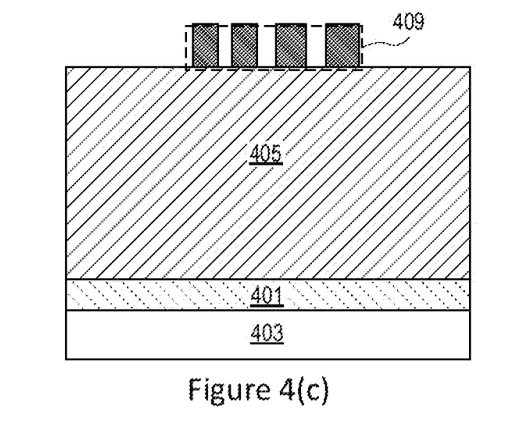
Figure 4D:
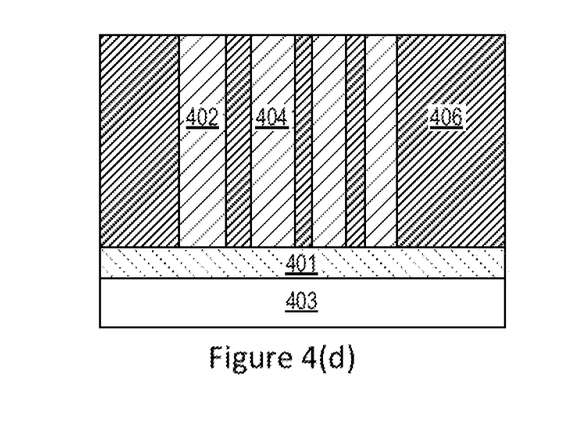

As shown in FIG. 4(b), a mask layer 407 may be formed above the layer 405. As shown in FIG. 4(c), the mask layer 407 may be patterned to form a pattern 409. Furthermore, as shown in FIG. 4(d), a plurality of pillars may be formed in the layer 405 based on the pattern 409. The pillars may be posts, e.g., a post 402, a post 404, of a metasurface lens formed on the backside of the substrate 401. In addition, separation material 406 may be used to fill the gaps between the posts.

FIGS. 5(a)-5(d) schematically illustrate a process 500 for forming a plurality of posts of a metasurface lens on a substrate of a wafer, in accordance with some embodiments. In embodiments, the process 400 may be applied to form the plurality of posts, e.g., the post 102, the post 104, of the metasurface lens 110 on a backside opposite to the front side of the substrate 101, as shown in FIG. 1(a). The post 102 or the post 104 includes a metasurface material that is transparent to light.

Figure 5A:
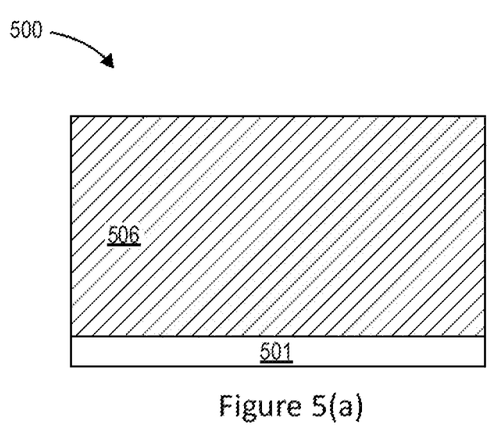
FIGS. 5(a)-5(d) schematically illustrate a process for forming a plurality of posts of a metasurface lens on a substrate of a wafer, in accordance with some embodiments.
Figure 5B:
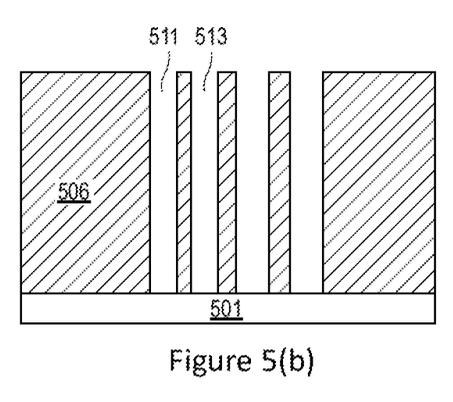

As shown in FIG. 5(a), a wafer with a substrate 501 may be provided. An image sensor device may be formed at a front side of the substrate 501, not shown. A layer 506 of separation material may be formed on a backside of the substrate 501. As shown in FIG. 5(b), a plurality of openings, e.g., an opening 511, an opening 513, may be formed through the layer 506. The openings may be formed by etching.

Figure 5C:
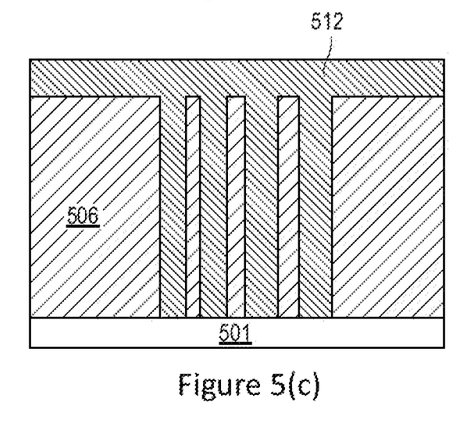
Figure 5D:
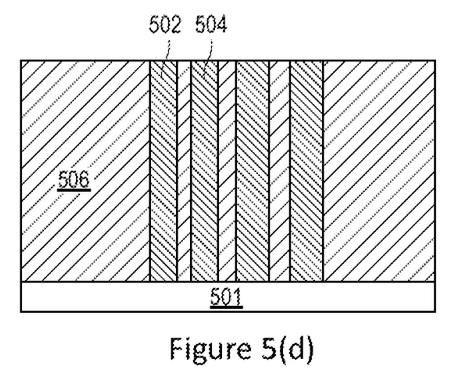

As shown in FIG. 5(c), a layer of metasurface material 512 is formed to fill the openings and further cover the surface of the layer 506. The layer 512 may include a metasurface material that is transparent to light. For example, the metasurface material may include TiO2, ZrO2, ZnTe, ZnxCd(1–x)Te, Al_xGa_1–xAs, AgTe, or AgSe. As shown in FIG. 5(d), a part of the layer 512 on top of the surface of the layer 506 may be removed, e.g., by chemical mechanical polishing (CMP) planarization to smoothing surfaces of the layer 512 and to form multiple posts, e.g., a post 502, a post 504, of a metasurface lens on the backside of the substrate 501.

FIGS. 6(a)-6(e) schematically illustrate a process 600 for forming a plurality of posts of a metasurface lens on a substrate of a wafer, in accordance with some embodiments. In embodiments, the process 600 may be applied to form the plurality of posts, e.g., the post 122, the post 124, of the metasurface lens 115 on a backside opposite to the front side of the substrate 121, as shown in FIG. 1(c). The post 122 or the post 124 includes a metasurface material that is transparent to light.

Figure 6A:
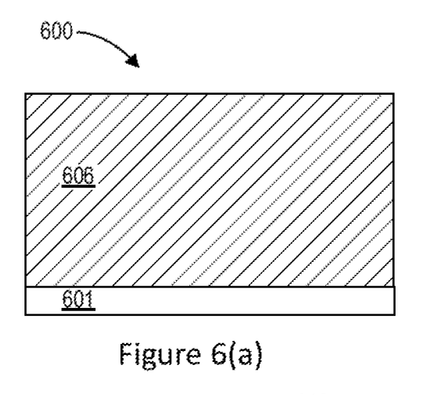
FIGS. 6(a)-6(e) schematically illustrate a process for forming a plurality of posts of a metasurface lens on a substrate of a wafer, in accordance with some embodiments.
Figure 6B:
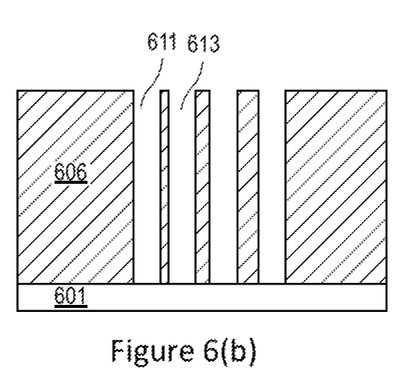

As shown in FIG. 6(a), a wafer with a substrate 601 may be provided. An image sensor device may be formed at a front side of the substrate 601, not shown. A layer 606 of separation material may be formed on a backside of the substrate 601. As shown in FIG. 6(b), a plurality of openings, e.g., an opening 611, an opening 613, may be formed through the layer 606. The openings may be formed by etching.

Figure 6C:
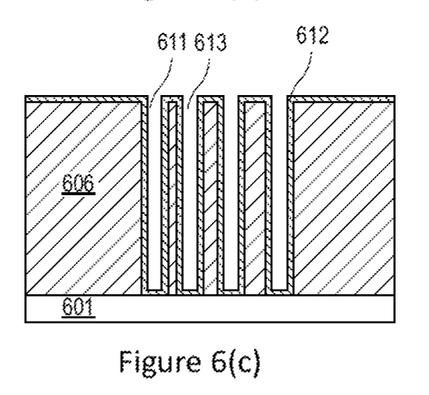

As shown in FIG. 6(c), a layer of metasurface material 612 is formed to conformally cover the surfaces of the openings, e.g., the opening 611, the opening 613, and the surfaces of the layer 606, while a part of the opening 611 and the opening 613 remaining open. The layer 612 may include a metasurface material that is transparent to light. For example, the metasurface material may include TiO2, ZrO2, ZnTe, ZnxCd(1–x)Te, Al_xGa_1–xAs, AgTe, or AgSe.

Figure 6D:
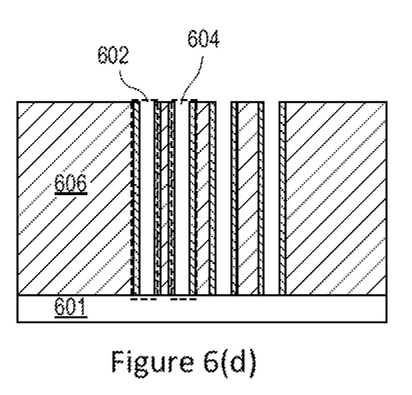

As shown in FIG. 6(d), a part of the layer 612 on top of the surface of the layer 606 may be removed, e.g., by chemical mechanical polishing (CMP) planarization to smoothing surfaces of the layer 612 and to form multiple posts, e.g., a post 602, a post 604, of a metasurface lens on the backside of the substrate 601. The post 602 may include an opening, which is a part of the opening 611, surrounded by the layer 612 on the walls of the opening 611.

Figure 6E:
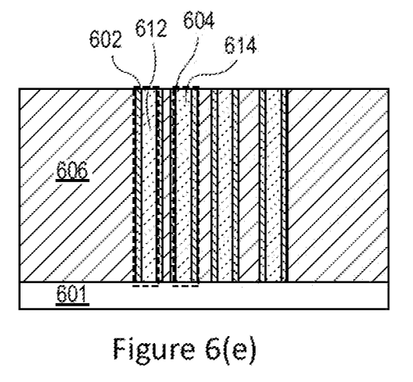

As shown in FIG. 6(e), a separation material 612 may fill the opening of the post 602, and a separation material 614 fills the opening of the post 604. The separation material 612 and the separation material 614 may be a same material as the separation material for the layer 606. In some other embodiments, the separation material 612 and the separation material 614 may be a different material as the separation material for the layer 606.

FIGS. 7(a)-7(e) schematically illustrate a process 700 for forming a plurality of posts of a metasurface lens on a substrate of a wafer, in accordance with some embodiments. In embodiments, the process 700 may be applied to form the plurality of posts, e.g., the post 132, the post 134, the post 136, of the metasurface lens 140 on a backside opposite to the front side of the substrate 131, as shown in FIG. 1(d). The post 132, the post 134, or the post 136 includes a metasurface material that is transparent to light.

Figure 7A:
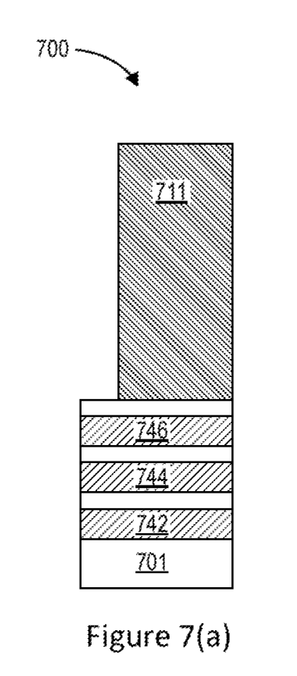
FIGS. 7(a)-7(e) schematically illustrate a process for forming a plurality of posts of a metasurface lens on a substrate of a wafer, in accordance with some embodiments.

As shown in FIG. 7(a), a wafer with a substrate 701 may be provided. An image sensor device may be formed at a front side of the substrate 701, not shown. Multiple layers, e.g., a layer 742, a layer 744, and a layer 746 of metasurface material may be formed on a backside opposite to the front side of the substrate 701. The layer 742, the layer 744, and the layer 746 may be separated by separation material. The layer 742, the layer 744, and the layer 746 may include a metasurface material that is transparent to light. For example, the metasurface material may include TiO2, ZrO2, ZnTe, ZnxCd(1–x)Te, Al_xGa_1–xAs, AgTe, or AgSe. The substrate 701 may include fused silica. A mask 711, e.g., a photoresist mask, may be formed on the layer 746 to have a first pattern as shown in FIG. 7(a).

Figure 7B:
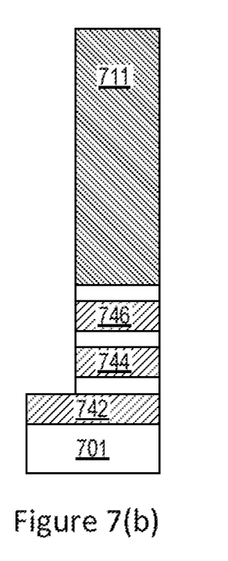
Figure 7C:
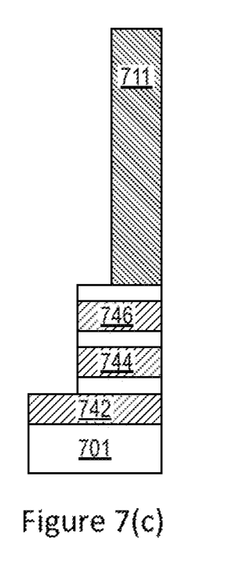
Figure 7D:
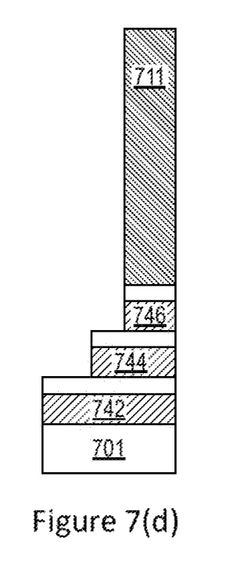
Figure 7E:
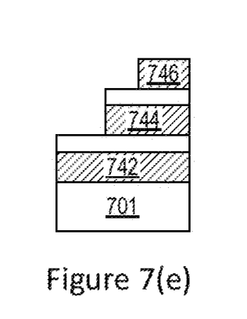

As shown in FIG. 7(b), the layer 744 and the layer 746 are etched away following the patterned mask 711. As shown in FIG. 7(c), the mask 711 is trimmed to be smaller. As shown in FIG. 7(d), the layer 744 may be etched away following the trimmed mask 711 shown in FIG. 7(c). In addition, as shown in FIG. 7(e), the mask 711 is removed, and a staircase of three layers of metasurface material are formed. A post formed by the patterned layer 742, a post formed by the patterned layer 744, and a post formed by the patterned layer 746, may correspond to the post 132, the post 134, the post 136, as shown in the FIG. 1(d). Hence, a post formed by the patterned layer 742, a post formed by the patterned layer 744, and a post formed by the patterned layer 746, are concentric, with decreasing diameter, similar to the post 132, the post 134, the post 136.

Figure 8:
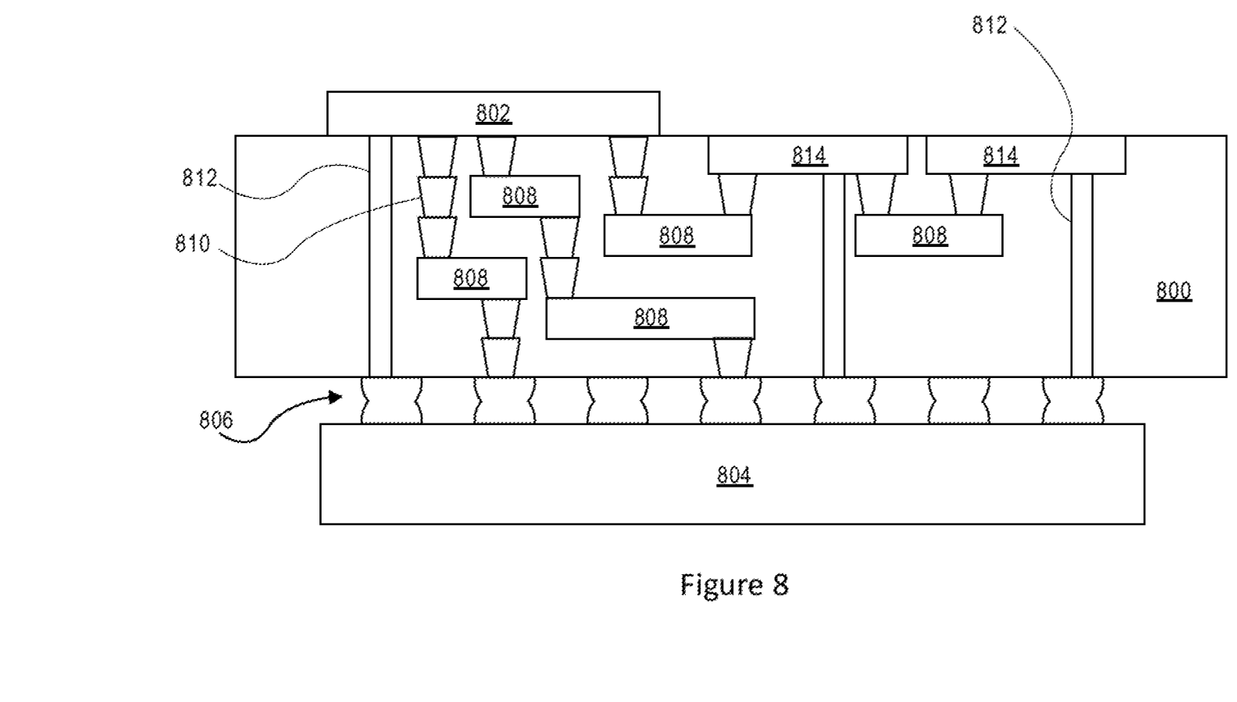
FIG. 8 schematically illustrates an interposer implementing one or more embodiments of the disclosure, in accordance with some embodiments.

FIG. 8 illustrates an interposer 800 that includes one or more embodiments of the disclosure. The interposer 800 is an intervening substrate used to bridge a first substrate 802 to a second substrate 804. The first substrate 802 may be, for instance, a substrate support for an optical device, e.g., the optical device 100 shown in FIG. 1(a), the optical device 120 shown in FIG. 1(c), the optical device 130 shown in FIG. 1(d), the optical device 200 shown in FIG. 2(a), the optical device 250 shown in FIG. 2(b). The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800.

In accordance with embodiments of the disclosure, apparatuses or processes disclosed herein may be used in the fabrication of interposer 800.

Figure 9:
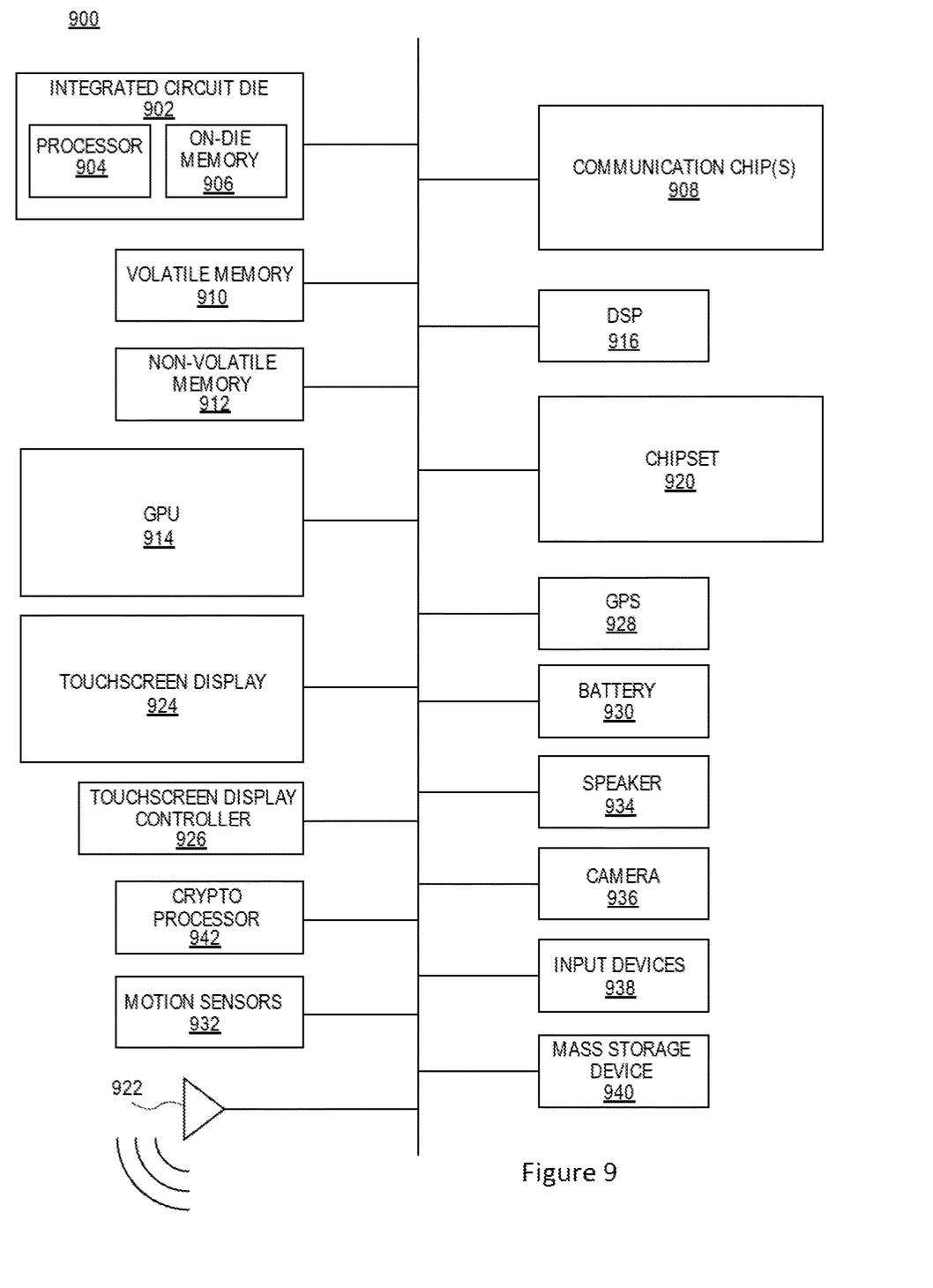
FIG. 9 schematically illustrates a computing device built in accordance with an embodiment of the disclosure, in accordance with some embodiments.

FIG. 9 illustrates a computing device 900 in accordance with one embodiment of the disclosure. The computing device 900 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 900 include, but are not limited to, an integrated circuit die 902 and at least one communications logic unit 908. In some implementations the communications logic unit 908 is fabricated within the integrated circuit die 902 while in other implementations the communications logic unit 908 is fabricated in a separate integrated circuit chip that may be bonded to a substrate or motherboard that is shared with or electronically coupled to the integrated circuit die 902. The integrated circuit die 902 may include a processor 904 as well as on-die memory 906, often used as cache memory, which can be provided by technologies such as embedded DRAM (eDRAM), or SRAM.

In embodiments, the computing device 900 may include a camera 936, which may include an optical device similar to the optical device presented herein, e.g., the optical device 100 shown in FIG. 1(a), the optical device 120 shown in FIG. 1(c), the optical device 130 shown in FIG. 1(d), the computing device 200 shown in FIG. 2(a), the computing device 250 shown in FIG. 2(b).

In embodiments, the computing device 900 may include a display or a touchscreen display 924, and a touchscreen display controller 926. A display or the touchscreen display 924 may include a FPD, an AMOLED display, a TFT LCD, a micro light-emitting diode (μLED) display, or others.

The computing device 900 may include other components that may or may not be physically and electrically coupled to the motherboard or fabricated within a SoC die. These other components include, but are not limited to, volatile memory 910 (e.g., dynamic random access memory (DRAM), non-volatile memory 912 (e.g., ROM or flash memory), a graphics processing unit 914 (GPU), a digital signal processor (DSP) 916, a crypto processor 942 (e.g., a specialized processor that executes cryptographic algorithms within hardware), a chipset 920, at least one antenna 922 (in some implementations two or more antenna may be used), a battery 930 or other power source, a power amplifier (not shown), a voltage regulator (not shown), a global positioning system (GPS) device 928, a compass, a motion coprocessor or sensors 932 (that may include an accelerometer, a gyroscope, and a compass), a microphone (not shown), a speaker 934, user input devices 938 (such as a keyboard, mouse, stylus, and touchpad), and a mass storage device 940 (such as hard disk drive, compact disk (CD), digital versatile disk (DVD), and so forth). The computing device 900 may incorporate further transmission, telecommunication, or radio functionality not already described herein. In some implementations, the computing device 900 includes a radio that is used to communicate over a distance by modulating and radiating electromagnetic waves in air or space. In further implementations, the computing device 900 includes a transmitter and a receiver (or a transceiver) that is used to communicate over a distance by modulating and radiating electromagnetic waves in air or space.

The communications logic unit 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 900 may include a plurality of communications logic units 908. For instance, a first communications logic unit 908 may be dedicated to shorter range wireless communications such as Wi-Fi, NFC, and Bluetooth and a second communications logic unit 908 may be dedicated to longer range wireless communications such as GPS, EDGE, GPRS, CDMA, WiMAX, LTE, Ev-DO, and others.

The processor 904 of the computing device 900 includes one or more devices, such as transistors. The term "processor" may refer to any device or portion of a device that processes electronic data from registers and/or memory to transform that electronic data into other electronic data that may be stored in registers and/or memory. The communications logic unit 908 may also include one or more devices, such as transistors.

In various embodiments, the computing device 900 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Some non-limiting Examples are provided below.

Example 1 may include an apparatus of optical device, comprising: a substrate of a wafer; an image sensor device formed on a front side of the substrate; and a plurality of posts of a metasurface lens formed on a backside opposite to the front side of the substrate, wherein a post of the plurality of posts includes a metasurface material that is transparent to light.

Example 2 may include the apparatus of example 1, wherein the metasurface material includes TiO2, ZrO2, ZnTe, ZnxCd(1−x)Te, Al_xGa_1−xAs, AgTe, or AgSe, and the substrate includes fused silica.

Example 3 may include the apparatus of examples 1-2, wherein the post is of a cylindrical or cubic shape.

Example 4 may include the apparatus of examples 1-2, wherein the post is of a cylindrical with a diameter in a range of about 40 nm to 100 nm, a height of about 400 nm to 600 nm, and a center-to-center pitch between two posts of the plurality of posts is about 60 nm.

Example 5 may include the apparatus of examples 1-4, wherein the metasurface material has a refractive index larger than or equal to 2.

Example 6 may include the apparatus of examples 1-5, wherein the plurality of posts includes a first post of a first shape, and a second post of a second shape different from the first shape.

Example 7 may include the apparatus of examples 1-6, wherein the plurality of posts are arranged in a hexagonal lattice, circular rows, or a square grid.

Example 8 may include the apparatus of examples 1-7, wherein the post includes a cavity filled by a separation material, and the separation material includes air, SiO2, SiNx, or carbon doped silicon oxide.

Example 9 may include the apparatus of examples 1-8, wherein the plurality of posts includes a first post in a first layer above the substrate, a second post in a second layer above the first layer, the first post having a first diameter is concentric with the second post having a second diameter smaller than the first diameter.

Example 10 may include the apparatus of examples 1-9, further comprising: a separation material between two posts of the plurality of posts, wherein the separation materials include carbon doped silicon oxide, SiO2, or SiNx.

Example 11 may include the apparatus of examples 1-10, wherein the wafer is a first wafer and the apparatus further includes a second wafer bonded to the image sensor device.

Example 12 may include the apparatus of example 10 and/or some other examples herein, wherein the second wafer includes a memory device or a processor, and the second wafer is bonded to the first wafer by fusion bonding or hybrid bonding.

Example 13 may include the apparatus of example 10 and/or some other examples herein, wherein the apparatus further includes a through silicon via (TSV) interconnect between the first wafer and the second wafer.

Example 14 may include a method for forming an optical device, the method comprising: forming an image sensor device on a front side of a substrate of a wafer; forming a plurality of posts of a metasurface lens on a backside opposite to the front side of the substrate, wherein a post of the plurality of posts includes a metasurface material that is transparent to light; and filling a gap between two posts of the plurality of posts by a separation material.

Example 15 may include the method of example 14, wherein the post includes a cavity, the separation material between two posts is a first material, and the method further includes: filling the cavity of the post by a second separation material.

Example 16 may include the method of examples 14-15, wherein the plurality of posts of the metasurface lens are a first plurality of posts in a first layer, and the method further includes: forming a second plurality of posts of the metasurface lens in a second layer above the first layer, wherein a first post of the first plurality of posts in the first layer is concentric with a second post of the second plurality of posts in the second layer, and the second post has a second diameter smaller than a first diameter of the first post.

Example 17 may include the method of examples 14-16, wherein the metasurface material includes TiO2, ZrO2, ZnTe, ZnxCd(1−x)Te, Al_xGa_1−xAs, AgTe, or AgSe; the substrate includes fused silica; and the post is of a cylindrical or cubic shape.

Example 18 may include the method of examples 14-17, wherein the wafer is a first wafer and the method further includes: bonding a second wafer to the image sensor device of the first wafer.

Example 19 may include the method of example 18 and/or some other examples herein, wherein the second wafer includes a memory device or a processor, and the second wafer is bonded to the first wafer by fusion bonding or hybrid bonding.

Example 20 may include the method of example 18 and/or some other examples herein, further including: forming a through silicon via (TSV) interconnect between the first wafer and the second wafer.

Example 21 may include a computing device, comprising: a first wafer with a substrate, wherein the first wafer includes an image sensor device on a front side of the substrate, and a plurality of posts of a metasurface lens on a backside opposite to the front side of the substrate; and a post of the plurality of posts includes a metasurface material that is transparent to light; and a second wafer bonded to the image sensor device of the first wafer.

Example 22 may include computing device of example 21, wherein the second wafer includes a memory device or a processor, and the second wafer is bonded to the first wafer by fusion bonding or hybrid bonding.

Example 23 may include computing device of examples 21-22, wherein the computing device further includes a through silicon via (TSV) interconnect between the first wafer and the second wafer.

Example 24 may include computing device of examples 21-23, wherein the metasurface material includes TiO2, ZrO2, ZnTe, ZnxCd(1−x)Te, Al_xGa_1−xAs, AgTe, or AgSe; the substrate includes fused silica; and the post is of a cylindrical or cubic shape.

Example 25 may include computing device of examples 21-24, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus of optical device, comprising:
a substrate of a wafer;
an image sensor device formed on a front side of the substrate; and
a plurality of posts of a metasurface lens formed on a backside opposite to the front side of the substrate, wherein a post of the plurality of posts includes a metasurface material that is transparent to light.

2. The apparatus of claim 1, wherein the metasurface material includes $TiO_2$, $ZrO_2$, ZnTe, ZnxCd(1−x)Te, AlxGa1−xAs, AgTe, or AgSe, and the substrate includes fused silica.

3. The apparatus of claim 1, wherein the post has a cylindrical shape or a cubic shape.

4. The apparatus of claim 1, wherein the post has a cylindrical shape with a diameter in a range of about 40 nm to 100 nm, a height of about 400 nm to 600 nm, and a center-to-center pitch between two posts of the plurality of posts is about 60 nm.

5. The apparatus of claim 1, wherein the metasurface material has a refractive index larger than or equal to 2.

6. The apparatus of claim 1, wherein the plurality of posts includes a first post of a first shape, and a second post of a second shape different from the first shape.

7. The apparatus of claim 1, wherein the plurality of posts are arranged in one of a hexagonal lattice, circular rows, or a square grid.

8. The apparatus of claim 1, wherein the post includes a cavity filled by a separation material, and the separation material includes at least one of air, SiO2, SiNx, or carbon doped silicon oxide.

9. The apparatus of claim 1, wherein the plurality of posts includes a first post in a first layer above the substrate, a second post in a second layer above the first layer, the first post having a first diameter is concentric with the second post having a second diameter smaller than the first diameter.

10. The apparatus of claim 1, further comprising:
a separation material between two posts of the plurality of posts, wherein the separation materials include at least one of carbon doped silicon oxide, SiO2, or SiNx.

11. The apparatus of claim 1, wherein the wafer is a first wafer and the apparatus further includes a second wafer bonded to the image sensor device.

12. The apparatus of claim 10, wherein the second wafer includes a memory device or a processor, and the second wafer is bonded to the first wafer by fusion bonding or hybrid bonding.

13. The apparatus of claim 10, wherein the apparatus further includes a through silicon via (TSV) interconnect between the first wafer and the second wafer.

14. A computing device, comprising:
a first wafer with a substrate, wherein the first wafer includes an image sensor device on a front side of the substrate, and a plurality of posts of a metasurface lens on a backside opposite to the front side of the substrate; and a post of the plurality of posts includes a metasurface material that is transparent to light; and
a second wafer bonded to the image sensor device of the first wafer.

15. The computing device of claim 14, wherein the second wafer includes a memory device or a processor, and the second wafer is bonded to the first wafer by fusion bonding or hybrid bonding.

16. The computing device of claim 14, wherein the computing device further includes a through silicon via (TSV) interconnect between the first wafer and the second wafer.

17. The computing device of claim 14, wherein the metasurface material includes at least one of $TiO_2$, $ZrO_2$, ZnTe, ZnxCd(1−x)Te, AlxGa1−xAs, AgTe, or AgSe; the substrate includes fused silica; and the post has a cylindrical shape or a cubic shape.

18. The computing device of claim 14, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS)

device, a compass, a Geiger counter, an accelerometer, a gyroscope, a speaker, and a camera coupled with the memory device.

\* \* \* \* \*